United States Patent
Yun et al.

(10) Patent No.: US 9,287,523 B2
(45) Date of Patent: Mar. 15, 2016

(54) ORGANIC LIGHT EMITTING DIODE DISPLAY

(71) Applicants: Jung-I Yun, Yongin (KR); Sang-Min Hong, Yongin (KR)

(72) Inventors: Jung-I Yun, Yongin (KR); Sang-Min Hong, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 13 days.

(21) Appl. No.: 13/950,530

(22) Filed: Jul. 25, 2013

(65) Prior Publication Data

US 2014/0225077 A1    Aug. 14, 2014

(30) Foreign Application Priority Data

Feb. 13, 2013   (KR) .......................... 10-2013-0015506

(51) Int. Cl.
| | |
|---|---|
| *H01L 23/29* | (2006.01) |
| *H01L 35/24* | (2006.01) |
| *H01L 51/52* | (2006.01) |

(52) U.S. Cl.
CPC ........... *H01L 51/525* (2013.01); *H01L 51/5246* (2013.01)

(58) Field of Classification Search
CPC ....................... H01L 51/5237; H01L 51/5296
USPC ........ 257/40, 88, 99, 100, 433, 434, 787–794
See application file for complete search history.

(56) References Cited

U.S. PATENT DOCUMENTS

| | | | | |
|---|---|---|---|---|
| 5,329,160 | A * | 7/1994 | Miura et al. ................. 257/710 |
| 6,070,321 | A * | 6/2000 | Brofman et al. ............... 29/840 |
| 6,210,815 | B1 * | 4/2001 | Ooishi .......................... 428/690 |
| 6,724,143 | B2 * | 4/2004 | Chen et al. ................... 313/512 |
| 6,791,660 | B1 * | 9/2004 | Hayashi et al. ............... 349/190 |
| 7,097,527 | B2 * | 8/2006 | Matsuoka ....................... 445/25 |
| 7,431,628 | B2 * | 10/2008 | Park et al. ....................... 445/25 |
| 7,544,542 | B2 * | 6/2009 | Too et al. ...................... 438/125 |
| 7,749,039 | B2 * | 7/2010 | Park ............................... 445/24 |
| 7,837,530 | B2 * | 11/2010 | Park ............................... 445/25 |
| 8,816,336 | B2 * | 8/2014 | Shimomura .................... 257/40 |
| 2004/0135496 | A1 * | 7/2004 | Park et al. ..................... 313/504 |
| 2004/0201348 | A1 * | 10/2004 | Anandan ....................... 313/512 |
| 2005/0140290 | A1 * | 6/2005 | Park et al. ..................... 313/512 |
| 2007/0170605 | A1 * | 7/2007 | Lee et al. ....................... 264/1.1 |
| 2007/0170839 | A1 * | 7/2007 | Choi et al. .................... 313/500 |

FOREIGN PATENT DOCUMENTS

| | | |
|---|---|---|
| KR | 10-2005-0068864 A | 7/2005 |
| KR | 10-2010-0081774 A | 7/2010 |
| KR | 10-2011-0008958 A | 1/2011 |

* cited by examiner

*Primary Examiner* — Ori Nadav
(74) *Attorney, Agent, or Firm* — Lee & Morse, P.C.

(57) ABSTRACT

An organic light emitting diode display includes a lower substrate having an organic light emitting diode thereon, an upper substrate on the lower substrate, an encapsulator between the lower substrate and an upper substrate to encapsulate the organic light emitting diode, the organic light emitting diode being encapsulated between the upper substrate and the lower substrate, a plurality of spacers between the lower substrate and the upper substrate, the plurality of spacers being disposed outside the encapsulator, a dummy metal provided between the spacers and the lower substrate, and a reinforcer on the dummy metal, the reinforcer wrapping the spacers.

8 Claims, 3 Drawing Sheets

ORGANIC LIGHT EMITTING DIODE DISPLAY

CROSS-REFERENCE TO RELATED APPLICATION

This application claims priority to and the benefit of Korean Patent Application No. 10-2013-0015506, filed in the Korean Intellectual Property Office on Feb. 13, 2013, the entire contents of which are incorporated herein by reference.

BACKGROUND

1. Field

Embodiments relate to an organic light emitting diode (OLED) display.

2. Description of the Related Art

An organic light emitting diode (OLED) display includes organic light emitting diodes that are formed with a hole injection electrode, an organic emission layer, and an electron injection electrode, and the organic light emitting diodes emit light by energy generating when excitons that are generated by coupling of electrons and holes within the organic emission layer are dropped from an exited state to a ground state. Since the organic light emitting diode display has a self-luminance characteristic and a separate light source is not required, unlike a liquid crystal display, thickness and weight thereof may be reduced. Further, since the organic light emitting diode display exhibits high quality characteristics such as low power consumption, high luminance, and rapid response speed, the organic light emitting diode display receives attention as a next generation display device for portable electronic devices.

The above information disclosed in this Background section is only for enhancement of understanding of the background of the art and therefore it may contain information that does not form the prior art that is already known in this country to a person of ordinary skill in the art.

SUMMARY

An organic light emitting diode display, including a lower substrate having an organic light emitting diode thereon, an upper substrate on the lower substrate, an encapsulator between the lower substrate and an upper substrate to encapsulate the organic light emitting diode, the organic light emitting diode being encapsulated between the upper substrate and the lower substrate, a plurality of spacers between the lower substrate and the upper substrate, the plurality of spacers being disposed outside the encapsulator, a dummy metal provided between the spacers and the lower substrate, and a reinforcer on the dummy metal, the reinforcer wrapping the spacers.

The spacers may be arranged in an oblique direction with respect to edges of the lower substrate.

The spacers may have a shape selected from a bar shape and an oval shape.

The shape of the spacers may have a longitudinal axis arranged in the oblique direction.

The spacers may be made of a polyimide.

The spacers may be formed at regular intervals.

A top surface of the dummy metal contacting the spacer may be larger than a bottom surface of the spacer contacting the dummy metal.

The dummy metal may be made of ITO/Ag/ITO or Ti/AL/Ti.

The reinforcer may be made of an epoxy resin.

BRIEF DESCRIPTION OF THE DRAWINGS

Features will become apparent to those of skill in the art by describing in detail example embodiments with reference to the attached drawings in which.

DETAILED DESCRIPTION

Figure 1:
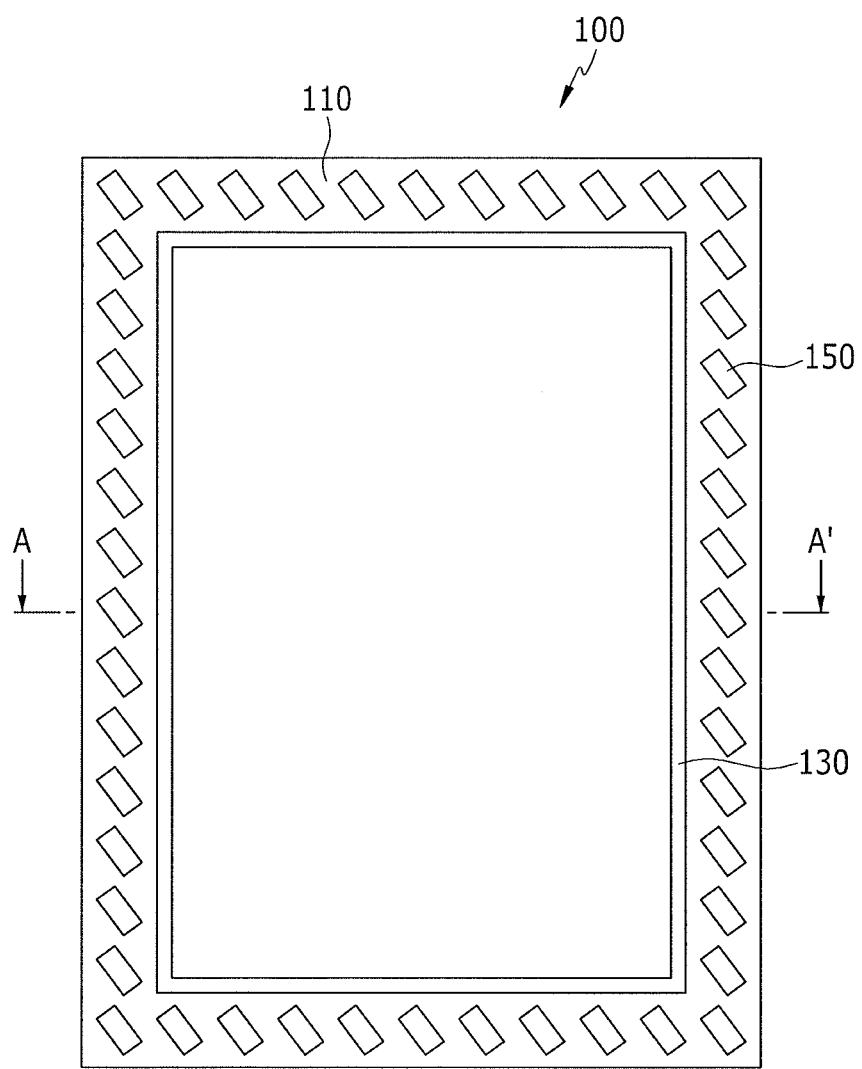
FIG. 1 shows a top plan view of an organic light emitting diode display according to an example embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art. The drawings and description are to be regarded as illustrative in nature and not restrictive. Like reference numerals designate like elements throughout the specification.

Throughout this specification and the claims that follow, when it is described that an element is "coupled" to another element, the element may be "directly coupled" to the other element or "electrically coupled" to the other element through a third element. Unless explicitly described to the contrary, the word "comprise" and variations such as "comprises" or "comprising" will be understood to imply the inclusion of stated elements but not the exclusion of any other elements.

An entire configuration of an organic light emitting diode (OLED) display according to an example embodiment will now be described.

Figure 2:
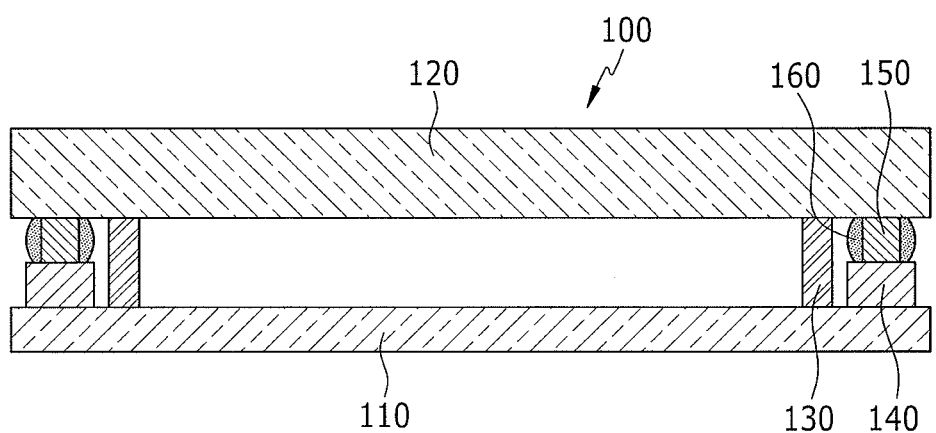
FIG. 2 shows a cross-sectional view of an organic light emitting diode display of FIG. 1 with respect to a line A-A'.

FIG. 1 shows a top plan view of an organic light emitting diode display according to an example embodiment, and FIG. 2 shows a cross-sectional view of an organic light emitting diode display of FIG. 1 with respect to a line A-A'.

In the example embodiment shown in FIG. 1 and FIG. 2, an organic light emitting diode display 100 includes a lower substrate 110, an upper substrate 120, an encapsulator 130, a dummy metal 140, a plurality of spacers 150, and a reinforcer 160.

In the present example embodiment, an organic light emitting diode (not shown) is formed on the lower substrate 110. The organic light emitting diode is formed to be patterned on the lower substrate 110. A scan driver (not shown) and a data driver (not shown) for driving the organic light emitting diodes are formed on the lower substrate 110.

When the organic light emitting diode (OLED) display 100 is a low temperature polycrystalline silicon (LTPS) type, it may include LTPS glass as an example of the lower substrate 110.

In the present example embodiment, the upper substrate 120 is formed on the lower substrate 110 and encapsulates the organic light emitting diode. The upper substrate 120 is bonded thereto with a predetermined gap by the encapsulator 130. The upper substrate 120 encapsulates the organic light emitting diode (not shown) formed on the lower substrate 110 against external contaminants, i.e., from the outside. The upper substrate 120 is made of various materials such as glass or plastic.

In the present example embodiment, the encapsulator 130 is provided between the lower substrate 110 and the upper substrate 120 to encapsulate the organic light emitting diode. One example of the encapsulator 130 may be a sealant.

A method for encapsulating the lower substrate 110 and the upper substrate 120 by using the encapsulator 130 will now be described. According to an example embodiment, while the lower substrate 110 is provided, the sealant is output to the lower substrate 110 by using a dispenser (not shown). The upper substrate 120 is closely attached to the lower substrate 110 and is then pressurized thereto to finish bonding of the lower substrate 110 to the upper substrate 120.

In the present example embodiment, the spacer 150 is disposed outside the encapsulator 130 that is formed between the lower substrate 110 and the upper substrate 120. The spacer 150 supports the lower substrate 110 and the upper substrate 120. An example material for the spacer 150 is a polyimide. The polyimide is a synthetic polymer having an imide combination. The polyimide is generated by forming fibers or films from a polyamide carboxylic acid solution, applying heat of about 300° C. thereto, and dehydrating the same. The polyimide solution has excellent electrical insulation. The polyimide is relatively stable when exposed to radiation, and it has great resistance against water.

In the present example embodiment, the spacer 150 is formed with a stable polyimide so when it is formed between the lower substrate 110 and the upper substrate 120, its deformation caused by an external stimulus is minimized to help stably support the lower substrate 110 and the upper substrate 120. The spacer 150 formed with the polyimide having excellent electrical insulation helps to stably realize the insulation of the lower substrate 110 from the upper substrate 120.

In the present example embodiment, a plurality of spacers 150 are formed at regular intervals. For example, a plurality of spacers 150 may be at each interval of 1 cm to 3 cm. When the spacers 150 are formed at intervals that are substantially less than 1 cm, the production cost may be increased. When the spacers 150 are formed at the intervals that are substantially greater than 3 cm, the lower substrate 110 and the upper substrate 120 may not be sufficiently supported.

In the present example embodiment, the dummy metal 140 is provided between the spacer 150 and the lower substrate 110. The dummy metal 140 allows the reinforcer 160 to be further easily formed on the circumference of the spacer 150. A material of the dummy metal 140 may be an ITO/Ag/ITO multilayered electrode or a (Ti/Al/Ti) titanium-aluminum-titanium conductive layer.

In the present example embodiment, the reinforcer 160 is formed on the dummy metal 140 and is formed to wrap the spacer 150. The reinforcer 160 improves rigidity of the spacer 150 so that the spacer 150 may further stably support the lower substrate 110 and the upper substrate 120. An example material of the reinforcer 160 may be an epoxy resin.

In the present example embodiment, in the dummy metal 140, a size of a top surface contacting the spacer 150 is formed to be greater than a size of a bottom surface of the spacer 150. For example, the top surface contacting the spacer 150 in the dummy metal 140 may be formed to be wider than the bottom surface of the spacer 150 by substantially 10% to 40%.

By the above-noted configuration, while the dummy metal 140 contacts the spacer, the reinforcer 160 may be further easily formed on a part at which the dummy metal 140 is protruded outside the spacer 150. That is, the reinforcer 160 may be further stably formed on the dummy metal 140 while the organic light emitting diode (OLED) display 100 is manufactured.

In the present example embodiment, the plurality of spacers 150 are formed on the plane in an oblique direction with respect to the lower substrate 110. The spacers 150 are formed as a bar type or an oval type. An area where the spacer 150 contacts the upper substrate 120 is maximized by the shape of the spacer 150 so the spacer 150 further stably supports the portion between the upper substrate 120 and the lower substrate 110.

The above-configured organic light emitting diode display 100 is formed such that the spacer 150 is formed to support the lower substrate 110 and the upper substrate 120, and the reinforcer 160 is formed to be on the circumference of the spacer 150 by the dummy metal 140. By the configuration, generation of cracks on the lower substrate 110 or upper substrate 120 by an external force may be reduced or prevented during the process of bonding the lower substrate 110 and the upper substrate 120 from among various processes for manufacturing the organic light emitting diode (OLED) display 100.

In addition, the organic light emitting diode display 100 according to the example embodiment has improved resistance compared to a general organic light emitting diode display.

Table 1 below shows measured data of force when a crack is generated in the organic light emitting diode display by an external force of a specific magnitude and bend displacements of the organic light emitting diode display. The results are acquired from the test shown in FIG. 3.

Figure 3:
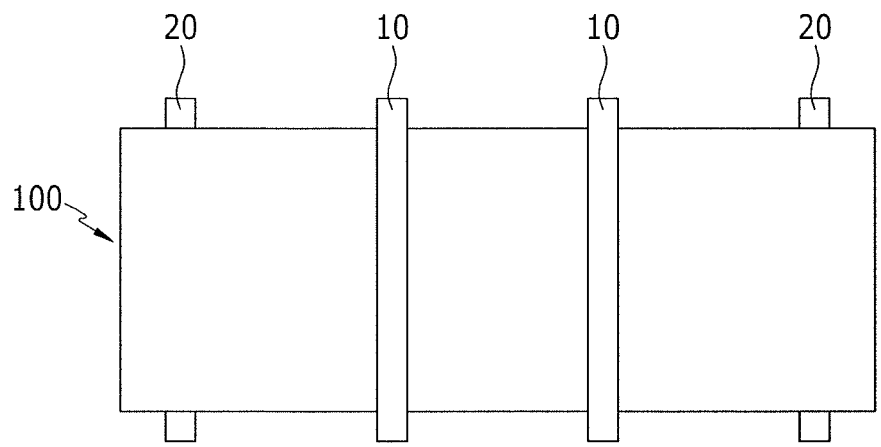
FIG. 3 shows a top plan view of a process for measuring resistance to an external force of an organic light emitting diode display according to an example embodiment and an organic light emitting diode display according to a comparative example.
Figure 4:
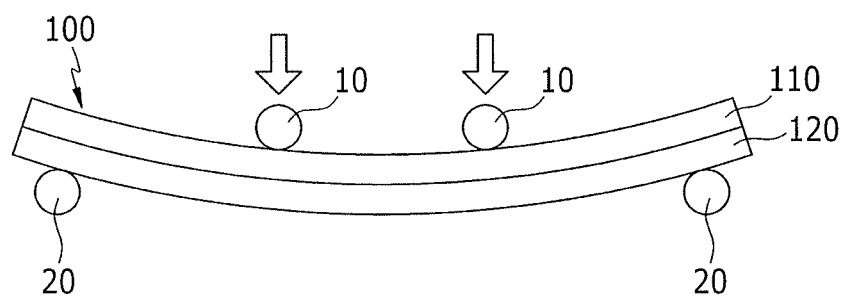
FIG. 4 shows a front view of a process for measuring resistance to an external force of an organic light emitting diode display according to an example embodiment and an organic light emitting diode display according to a comparative example shown in FIG. 3.

FIG. 3 shows a top plan view of a process for measuring resistance to an external force of an organic light emitting diode display according to an example embodiment and an organic light emitting diode display according to a comparative example, and FIG. 4 shows a front view of a process for measuring resistance to an external force of an organic light emitting diode display according to an example embodiment and an organic light emitting diode display according to a comparative example shown in FIG. 3.

Referring to FIG. 3 and FIG. 4, when the organic light emitting diode display 100 according to an example embodiment including the spacer 150 and the organic light emitting diode display according to the comparative example not including the spacer 150 are provided, two rollers support both ends of the organic light emitting diode display 100, and other two rollers are moved to the bottom from the top. Here, the bend displacement is a length of the center portion to the lowest point, the center portion being bent to the point where the crack is generated with reference to the state in which the organic light emitting diode display 100 is disposed to be flat. The spacers 150 are formed at intervals of 3 cm in the organic light emitting diode display 100.

As expressed in Table 1, the organic light emitting diode display according to the comparative example generated a crack at 175.8 Mpa, and the organic light emitting diode display 100 according to the embodiment generated a crack at 233.7 Mpa. Further, the bend displacement of the organic light emitting diode display according to the comparative example is 9.2 cm until the crack is generated, and the bend displacement of the organic light emitting diode display 100 according to the embodiment is 20.6 cm until the crack is generated. It is found from the result that the organic light emitting diode display 100 according to the embodiment has substantially improved resistance against external force compared to the organic light emitting diode display according to the comparative example.

TABLE 1

|  | Force (Mpa) | Bend displacement (cm) |
| --- | --- | --- |
| Comparative Example (spacer not included) | 175.8 | 9.2 |
| Example Embodiment (spacer not included) | 233.7 | 20.6 |

By way of summation and review, when an organic light emitting diode display is manufactured, a method for applying a sealant between a lower substrate and an upper substrate and pressurizing them may be used, and the lower substrate or the upper substrate may become cracked during this manufacturing process.

As described above, embodiments relate to an organic light emitting diode (OLED) display for outputting an image. Embodiments may provide an organic light emitting diode display configured to help prevent generation of cracks on a lower substrate or an upper substrate. According to the embodiment, the organic light emitting diode (OLED) display may avoid generation of cracks on the lower substrate or the upper substrate by an external force when the lower substrate and the upper substrate are bonded.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated.

Accordingly, it will be understood by those of skill in the art that various changes in form and details may be made without departing from the spirit and scope of the present invention as set forth in the following claims.

What is claimed is:

1. An organic light emitting diode display, comprising:
a lower substrate having an organic light emitting diode thereon;
an upper substrate on the lower substrate;
an encapsulator between the lower substrate and the upper substrate to encapsulate the organic light emitting diode, the organic light emitting diode being encapsulated between the upper substrate and the lower substrate;
a plurality of spacers between the lower substrate and the upper substrate, the plurality of spacers being disposed outside the encapsulator;
a respective dummy metal provided between each of the spacers and the lower substrate; and
a respective reinforcer wrapping each of the spacers, wherein:
for each of said respective reinforcer, the reinforcer has a length in a height direction equal to that of the spacer corresponding to the reinforcer, the reinforcer being made of an epoxy resin, and
a top surface of the dummy metal contacts a bottom surface of the corresponding spacer, and the top surface of the dummy metal is larger than bottom surfaces of the reinforcer and corresponding spacer combined.

2. The organic light emitting diode display of claim 1, wherein
the spacers are arranged in an oblique direction with respect to edges of the lower substrate.

3. The organic light emitting diode display of claim 2, wherein the spacers have a shape selected from a bar shape and an oval shape.

4. The organic light emitting diode display of claim 3, wherein the spacers are rectangular and have a longitudinal axis arranged in the oblique direction relative to a longitudinal edge of the lower substrate.

5. The organic light emitting diode display of claim 1, wherein the spacers are made of a polyimide.

6. The organic light emitting diode display of claim 1, wherein the spacers are formed at regular intervals.

7. The organic light emitting diode display of claim 1, wherein the dummy metal is made of ITO/Ag/ITO or Ti/AL/Ti.

8. The organic light emitting diode display of claim 1, wherein the reinforcer completely encloses the corresponding spacer.

* * * * *